United States Patent
Matsumoto

(10) Patent No.: US 9,966,229 B2
(45) Date of Patent: May 8, 2018

(54) SUPPORTING CASE AND MULTI CHARGED PARTICLE BEAM DRAWING APPARATUS

(71) Applicant: NuFlare Technology, Inc., Yokohama-shi (JP)

(72) Inventor: Hiroshi Matsumoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days. days.

(21) Appl. No.: 15/273,864

(22) Filed: Sep. 23, 2016

(65) Prior Publication Data

US 2017/0110288 A1    Apr. 20, 2017

(30) Foreign Application Priority Data

Oct. 20, 2015   (JP) .................................. 2015-206464

(51) Int. Cl.
   *H01J 37/30*   (2006.01)

(52) U.S. Cl.
   CPC ... *H01J 37/3007* (2013.01); *H01J 2237/2007* (2013.01); *H01J 2237/317* (2013.01)

(58) Field of Classification Search
   USPC .................................................... 250/440.11
   See application file for complete search history.

(56) References Cited

U.S. PATENT DOCUMENTS

| | | | | |
|---|---|---|---|---|
| 6,768,125 B2 * | 7/2004 | Platzgummer | ......... | B82Y 10/00 250/492.1 |
| 8,546,767 B2 * | 10/2013 | Platzgummer | ......... | B82Y 10/00 250/396 R |

FOREIGN PATENT DOCUMENTS

| | | |
|---|---|---|
| JP | 7-254540 | 10/1995 |
| JP | 9-134869 | 5/1997 |
| JP | 2004-40076 A | 2/2004 |
| JP | 2004-349290 | 12/2004 |
| JP | 2009-502033 A | 1/2009 |
| JP | 2011-171713 A | 9/2011 |

OTHER PUBLICATIONS

Korean Office Action dated Sep. 12, 2017 in Patent Application No. 10-2016-0126240.

* cited by examiner

*Primary Examiner* — Phillip A Johnston

(74) *Attorney, Agent, or Firm* — Oblon, McClelland, Maier & Neustadt, L.L.P.

(57) ABSTRACT

In one embodiment, a supporting case includes a lower case member and an upper case member. The mounting substrate is pinched between a lower cylindrical supporting portion and a upper cylindrical supporting portion. Peripheral regions of the mounting substrate that are on a peripheral side with respect to a part pinched between the lower cylindrical supporting portion and the upper cylindrical supporting portion are positioned in a space defined by a bottom plate portion, a lower peripheral-wall portion, and the lower cylindrical supporting portion of the lower case member and a top lid portion, an upper peripheral-wall portion, and the upper cylindrical supporting portion of the upper case member.

15 Claims, 13 Drawing Sheets

SUPPORTING CASE AND MULTI CHARGED PARTICLE BEAM DRAWING APPARATUS

CROSS REFERENCE TO RELATED APPLICATION

This application is based upon and claims benefit of priority from the Japanese Patent Application No. 2015-206464, filed on Oct. 20, 2015, the entire contents of which are incorporated herein by reference.

FIELD

The present invention relates to a supporting case that supports a substrate carrying a blanking plate and to a multi charged particle beam drawing apparatus that includes the supporting case.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is drawn by using an electron-beam drawing apparatus, in which a so-called electron-beam lithography technique is employed.

A drawing apparatus using multi-beam can emit more beams at a time than in a case of drawing with a single electron beam and can greatly improve throughput. In such a multi-beam drawing apparatus, for example, an electron beam emitted from an electron gun is passed through an aperture member having a plurality of holes, whereby multiple beams (a plurality of electron beams) are formed. The multiple beams pass through respective blankers provided in a blanking plate. The blankers individually perform blanking deflection on the electron beams passing therethrough. Some electron beams that have been deflected by the blankers are blocked by the blankers, while the other electron beams that have not been deflected fall onto a sample.

Each of the beams forming the multi-beam has a small size. To improve throughput, many beams are necessary and the blanking plate needs to mount wiring lines and circuits for independently controlling the potentials of electrodes of the blankers. Data that defines the on or off state of each of the beams is transferred to the blanking plate. The amount of data transferred to the blanking plate is far greater than the amount of data required in a case of drawing with a single electron beam.

The blanking plate is die-bonded to a mounting substrate. The mounting substrate is provided with a circuit device for power stabilization, a control circuit, a relay circuit for data transfer, and so forth. A column of a drawing apparatus in which the mounting substrate mounting the blanking plate is disposed has a vacuum thereinside and has a low rate of heat exhaustion. Therefore, the above circuit devices may fail to be cooled satisfactorily and may become hot, generating some gas. Moreover, if the circuit devices are made of any materials that generate gas in a vacuum, such gas may be generated from the circuit devices in the vacuum column. If any gas is generated in the column, the aperture member may be contaminated and the holes for forming multiple beams may be clogged. In addition, if the circuit devices become hot, the circuit devices may cause malfunctions.

In another case, electrons scattered at the aperture member may charge up the surface or inside of the circuit devices on the mounting substrate and may cause malfunctions. In yet another case, an electromagnetic field generated by the electric current flowing through the circuit devices and the mounting substrate may disturb the paths of the electron beams and may deteriorate the drawing accuracy.

DETAILED DESCRIPTION

In one embodiment, a supporting case supports a mounting substrate for mounting a blanking plate. The blanking plate performs blanking deflection on a plurality of beams individually in a multi charged particle beam drawing apparatus. The supporting case includes a lower case member including a bottom plate portion, a lower peripheral-wall portion standing from a peripheral edge of the bottom plate portion, and a lower cylindrical supporting portion standing from a peripheral edge of a lower opening provided in a plate central part of the bottom plate portion; and an upper case member including a top lid portion, an upper peripheral-wall portion hanging from a peripheral edge of the top lid portion, and an upper cylindrical supporting portion hanging from a peripheral edge of an upper opening provided in a plate central part of the top lid portion. The lower peripheral-wall portion and the upper peripheral-wall portion are fitted with each other, with the mounting substrate being pinched between the lower cylindrical supporting portion and the upper cylindrical supporting portion. Peripheral regions of the mounting substrate that are on a peripheral side with respect to a part pinched between the lower cylindrical supporting portion and the upper cylindrical supporting portion are positioned in a space defined by the bottom plate portion, the lower peripheral-wall portion, and the lower cylindrical supporting portion of the lower case member and the top lid portion, the upper peripheral-wall portion, and the upper cylindrical supporting portion of the upper case member.

The following embodiments each concern a case where an electron beam is employed as an exemplary charged-particle beam. Note that the charged-particle beam is not limited to an electron beam and may be an ion beam or the like.

First Embodiment

Figure 1:
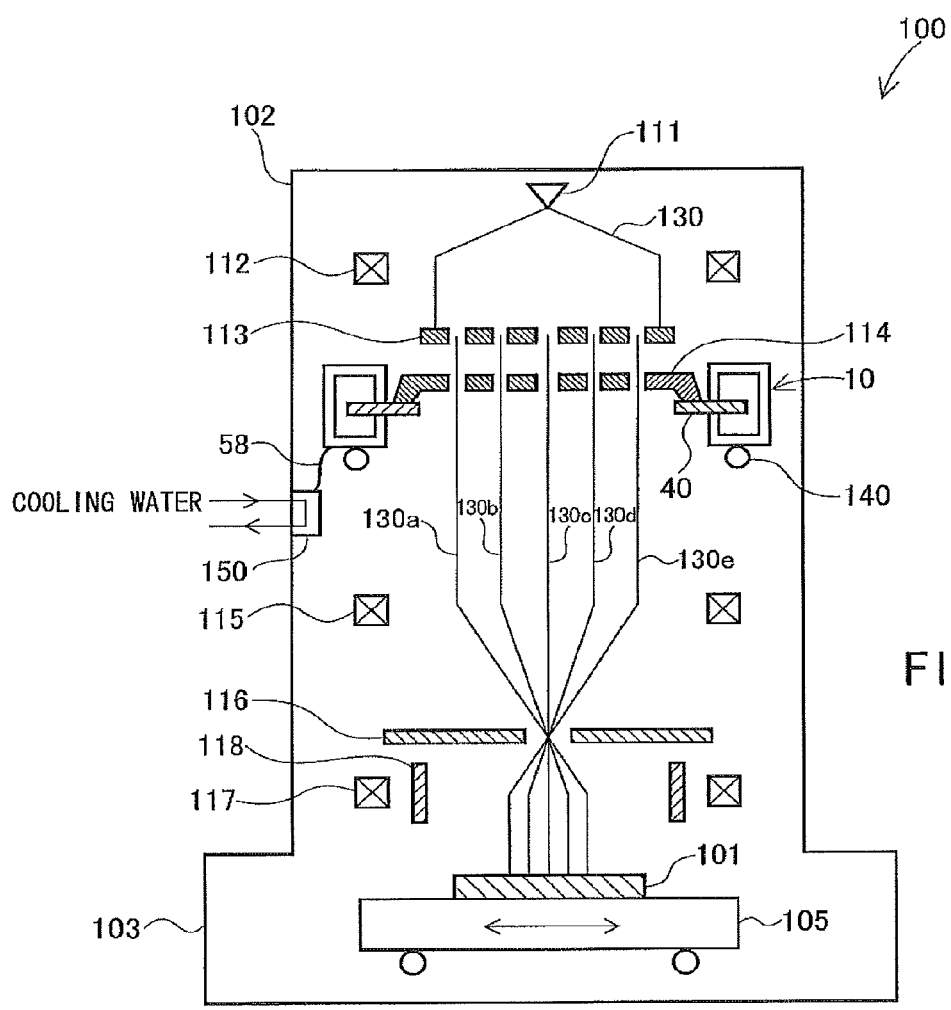
FIG. 1 is a schematic diagram of a drawing apparatus according to a first embodiment of the present invention.

FIG. 1 is a schematic diagram of a drawing apparatus according to a first embodiment. A drawing apparatus 100 illustrated in FIG. 1 is an exemplary multi charged particle beam drawing apparatus. The drawing apparatus 100 includes an electron beam column 102 and a drawing chamber 103. The electron beam column 102 is provided thereinside with an electron gun 111, an illuminating lens 112, an aperture member 113, a blanking plate 114, a reducing lens 115, a restricting aperture member 116, an objective lens 117, and a deflector 118. The blanking plate 114 is mounted on (carried by) a mounting substrate 40. A supporting case 10 that supports the mounting substrate 40 is disposed in the electron beam column 102.

The electron beam column 102 is provided with a rotating unit 140 that horizontally rotates the supporting case 10, and a cooling plate 150 through which cooling water flows. The supporting case 10 and the cooling plate 150 are connected to each other with a heat-conducting cable 58.

The drawing chamber 103 is provided thereinside with an XY stage 105. The XY stage 105 carries a sample 101, such as a mask, when drawing is performed. The sample 101 is a substrate as an object of drawing. The sample 101 may be an exposure mask used in manufacturing a semiconductor device, a semiconductor substrate (silicon wafer) on which a semiconductor device is manufactured, or the like. The sample 101 may also be a mask blank coated with resist and having nothing drawn thereon yet.

The aperture member 113 has holes (apertures) arranged at a predetermined pitch in a pattern of m vertical columns by n horizontal rows (m, n≤2). The holes are rectangular and are of the same shape and size. The shape of the holes may alternatively be circular. Different portions of an electron beam 130 pass through the plurality of holes, respectively, whereby multiple beams 130a to e are formed.

The blanking plate 114 has passing holes arranged in correspondence with the arrangement of the holes of the aperture member 113. The passing holes are each provided with a pair of electrodes (a blanker). The electron beams passing through the respective passing holes are deflected independently of each other with a voltage applied to the respective pairs of electrodes. Thus, a plurality of blankers perform blanking deflection on the respective beams, forming the multi-beam, having passed through the respective holes (apertures) of the aperture member 113.

The electron beam 130 emitted from the electron gun 111 (an emitting unit) substantially perpendicularly illuminates the entirety of the aperture member 113 with the aid of the illuminating lens 112. The aperture member 113 has rectangular holes (apertures). The electron beam 130 illuminates an area having all of the plurality of holes. Since the electron beam 130 passes through the plurality of holes of the aperture member 113, a plurality of rectangular electron beams (multiple beams) 130a to e are formed. The multiple beams 130a to e pass through the respective blankers of the blanking plate 114. The blankers individually deflect the respective electron beams passing therethrough.

The multiple beams 130a to e having passed through the blanking plate 114 are reduced by the reducing lens 115 and travel toward a hole provided at the center of the restricting aperture member 116. Here, some electron beams that have been deflected by the blankers of the blanking plate 114 miss the hole at the center of the restricting aperture member 116 and are blocked by the restricting aperture member 116. Meanwhile, other electron beams that have not been deflected by the blankers of the blanking plate 114 pass through the hole at the center of the restricting aperture member 116. By turning on/off the blankers, blanking is controlled, and the operation of beam-on/off is controlled.

As described above, the restricting aperture member 116 blocks some beams that have been deflected in such a manner as to be turned off by corresponding ones of the blankers. Thus, beams obtained during a period from the point of beam-on to the point of beam-off and that have passed through the restricting aperture member 116 form beams for a single shot.

The multiple beams having passed through the restricting aperture member 116 are focused by the objective lens 117 into a pattern image at a desired reduction ratio. The multiple beams are all deflected in the same direction by the deflector 118 and are applied to respective positions of the sample 101. While the XY stage 105 is continuously moving, the positions of application of the beams are controlled by the deflector 118 in such a manner as to follow the movement of the XY stage 105. The multiple beams that are emitted at a time are ideally arranged at a pitch calculated by multiplying the arrangement pitch of the plurality of holes in the aperture member 113 by the above desired reduction ratio. The drawing apparatus 100 performs a drawing operation by a raster scan method in which shot beams are continuously and sequentially applied. To draw a desired pattern, unnecessary beams are controlled to be turned off by controlling blanking.

When the rotating unit 140 horizontally rotates the supporting case 10, the blanking plate 114 horizontally rotates. Thus, the direction of arrangement of the multiple beams applied to the sample 101 and the direction of movement of the XY stage 105 can be aligned with each other.

Figure 2:
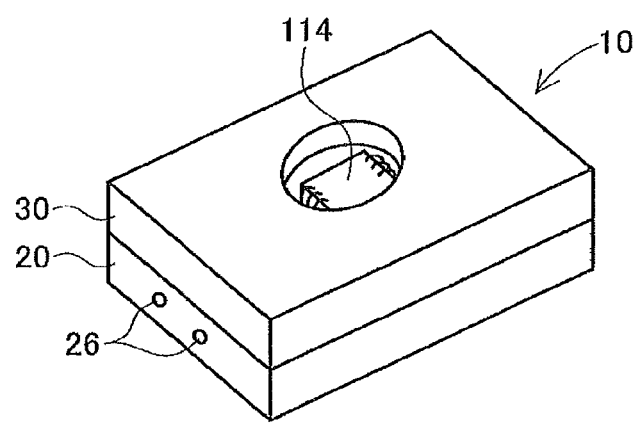
FIG. 2 is a perspective view of a supporting case supporting a mounting substrate carrying a blanking plate.
Figure 3:
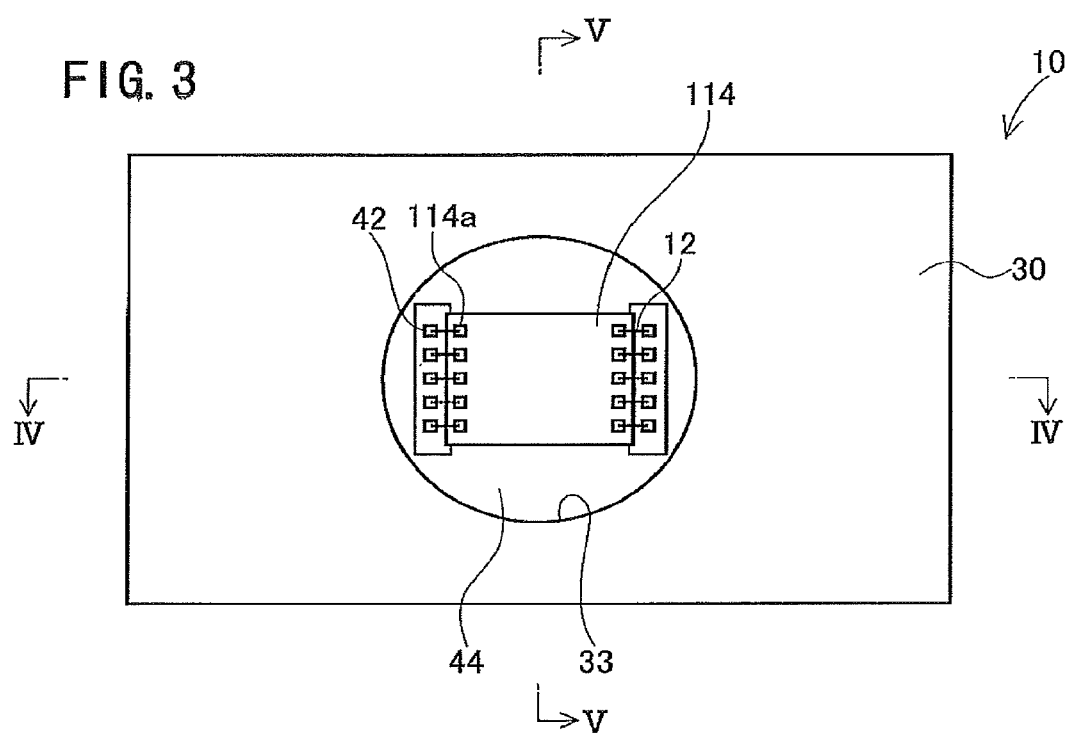
FIG. 3 is a top view of the supporting case.
Figure 4:
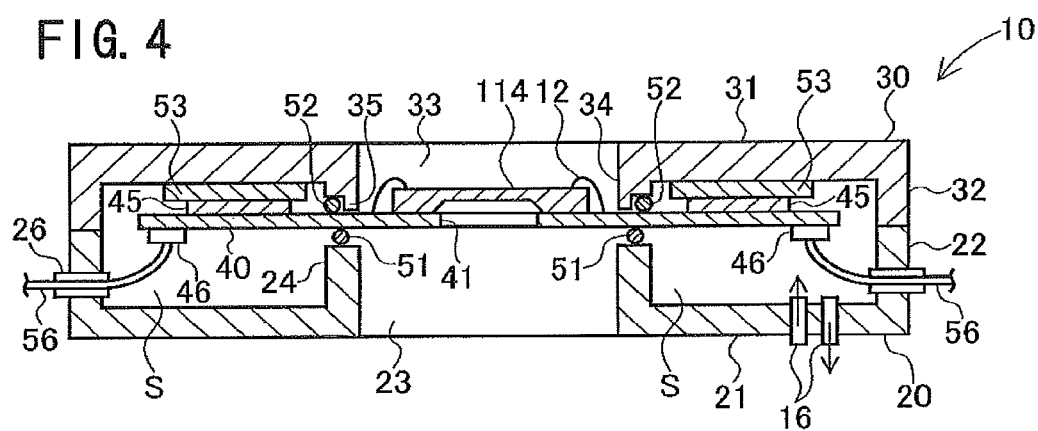
FIG. 4 is a sectional view taken along line IV-IV illustrated in FIG. 3.
Figure 5:
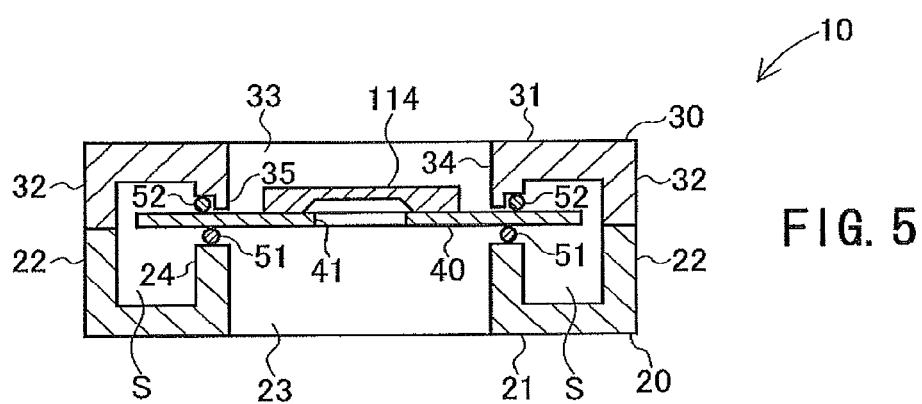
FIG. 5 is a sectional view taken along line V-V illustrated in FIG. 3.

Now, the mounting substrate 40 that carries the blanking plate 114 and the supporting case 10 that supports the mounting substrate 40 will be described with reference to FIGS. 2 to 9. FIG. 2 is a perspective view of the supporting case 10 supporting the mounting substrate 40. FIG. 3 is a top view. FIG. 4 is a sectional view taken along line IV-IV illustrated in FIG. 3. FIG. 5 is a sectional view taken along line V-V illustrated in FIG. 3.

The supporting case 10 includes a lower case member 20 and an upper case member 30. The lower case member 20 and the upper case member 30 pinch and support the mounting substrate 40 therebetween. The lower case member 20 and the upper case member 30 are made of a nonmagnetic material such as copper.

Figure 6:
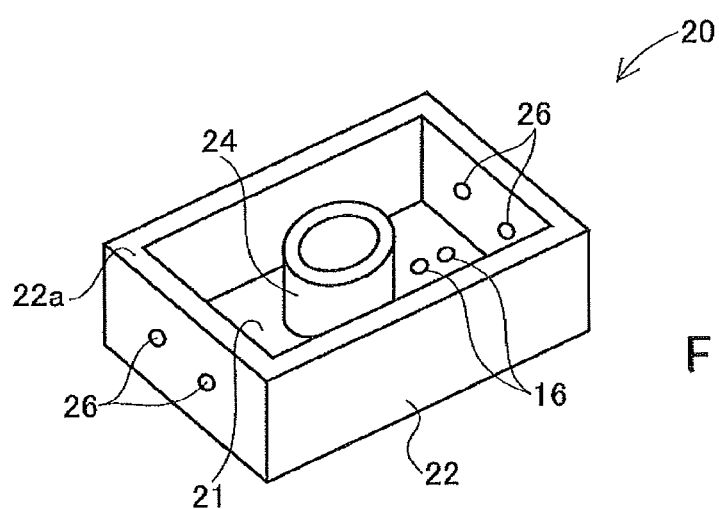
FIG. 6 is a perspective view of a lower case member.

As illustrated in FIG. 6, the lower case member 20 includes a substantially rectangular bottom plate portion 21, a lower peripheral-wall portion 22 standing from the peripheral edge of the bottom plate portion 21, and a lower cylindrical supporting portion 24 standing from the peripheral edge of a lower opening 23 (see FIG. 4) provided in a plate central part (the center) of the bottom plate portion 21. The lower opening 23 is an opening that allows the electron beam to pass therethrough. The bottom plate portion 21 has a pressure-relief valve 16, which will be described below. The lower peripheral-wall portion 22 has feedthroughs 26. The lower peripheral-wall portion 22 has a greater height than the lower cylindrical supporting portion 24 in the vertical direction.

Figure 7:
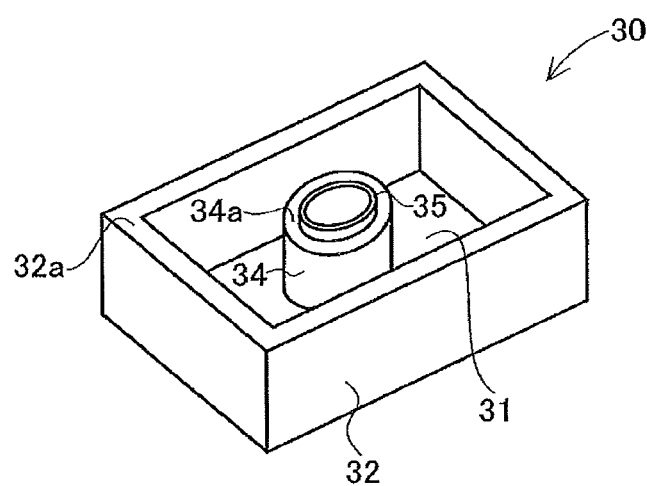
FIG. 7 is a perspective view of an upper case member.

FIG. 7 is a perspective view of the upper case member 30. The upper case member 30 illustrated in FIG. 7 is turned upside down. The upper case member 30 includes a substantially rectangular top lid portion 31, an upper peripheral-wall portion 32 hanging from the peripheral edge of the top lid portion 31, and an upper cylindrical supporting portion 34 hanging from the peripheral edge of an upper opening 33 (see FIGS. 4 and 9) provided in a plate central part (the center) of the top lid portion 31. The upper opening 33 is an opening that allows the electron beam to pass therethrough. The upper peripheral-wall portion 32 has a greater height than the upper cylindrical supporting portion 34 in the vertical direction.

A projecting part 35 projects downward from part of a lower end face 34a of the upper cylindrical supporting portion 34. The projecting part 35 has an annular shape extending along the lower end face 34a. For example, the upper cylindrical supporting portion 34 and the projecting part 35 have the same inside diameter, and the inner peripheral surface of the upper cylindrical supporting portion 34 and the inner peripheral surface of the projecting part 35 are continuous with each other with no step. The outside diameter of the upper cylindrical supporting portion 34 is larger than the outside diameter of the projecting part 35.

The bottom plate portion 21 of the lower case member 20 and the top lid portion 31 of the upper case member 30 are of the same or substantially the same size. Furthermore, the lower cylindrical supporting portion 24 and the upper cylindrical supporting portion 34 have the same or substantially the same inside and outside diameters.

Figure 8:
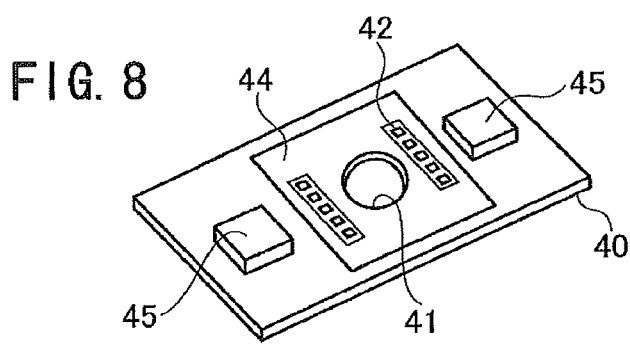
FIG. 8 is a perspective view of the mounting substrate.

FIG. 8 is a perspective view of the mounting substrate 40 on which the blanking plate 114 is to be mounted. The mounting substrate 40 has a substantially rectangular shape with an opening 41 for allowing the passage of the electron beam being provided in a plate central part (the center) thereof. Pad portions 42 are provided near the opening 41. The pad portions 42 are connected to pad portions 114a of the blanking plate 114 with wires 12 (see FIGS. 3 and 4).

A region of the mounting substrate 40 excluding peripheral portions and the positions having the pad portions 42 are plated with gold, whereby surfaces including the side surface at the opening 41 are covered with a gold plate 44. As to be described below, in a state where the mounting substrate 40 is supported by the supporting case 10, at least a region that is not positioned in a space S of the supporting case 10 is covered with the gold plate 44. Gold plating may be given all over the mounting substrate 40.

The mounting substrate 40 is provided with circuit devices 45 at peripheral portions of the upper surface thereof. In the example illustrated in FIG. 8, the circuit devices 45 are provided at two respective long-side ends of the mounting substrate 40. The circuit devices 45 include a plurality of circuit devices such as a circuit device for power stabilization, a control circuit, and a relay circuit for data transfer. The mounting substrate 40 is also provided with connectors 46 (see FIG. 4) at peripheral portions of the lower surface thereof. The connectors 46 are provided for connection of optical fibers 56 for signal transmission. Data transmitted to the mounting substrate 40 through the optical fibers by using an FPGA as a relay circuit for data transfer is transferrable as an electrical signal to blanking apertures after being buffered by the FPGA. A high-speed FPGA generates high heat and requires a cooling mechanism having low thermal resistance.

The mounting substrate 40 is, for example, a ceramic substrate and has a smaller size than the bottom plate portion 21 of the lower case member 20 and the top lid portion 31 of the upper case member 30.

Figure 9:
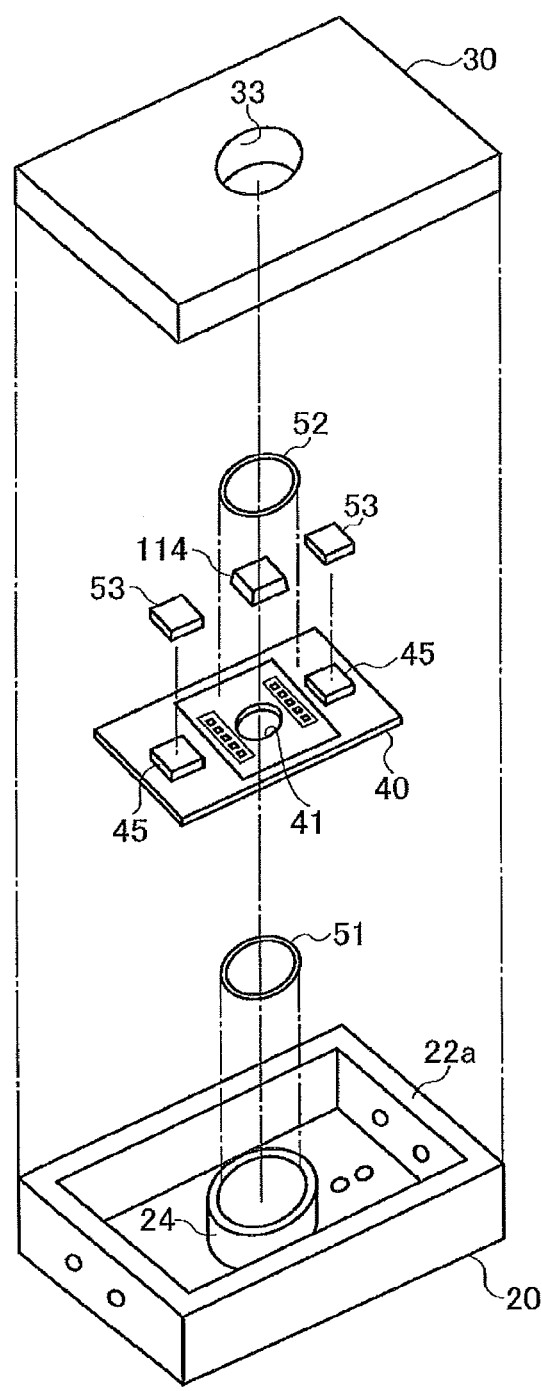
FIG. 9 is an exploded perspective view of the supporting case.

The blanking plate 114 is disposed over the opening 41 of the mounting substrate 40 and is fixed to the mounting substrate 40 by die bonding. Furthermore, the pad portions 114a and the pad portions 42 are connected to each other with the wires 12 by wire bonding. The mounting substrate 40 thus having the blanking plate 114 thereon is disposed between the lower case member 20 and the upper case member 30 as illustrated in FIG. 9, and the lower peripheral-wall portion 22 and the upper peripheral-wall portion 32 are fitted with each other by bringing a peripheral-wall upper end face 22a of the lower case member 20 and a peripheral-wall lower end face 32a of the upper case member 30 (see FIG. 7) into contact with each other.

In this step, an O ring 51 is provided between the mounting substrate 40 and the lower cylindrical supporting portion 24, and an O ring 52 is provided between the mounting substrate 40 and the upper cylindrical supporting portion 34. Furthermore, heat-conducting sheets 53 are provided over the respective circuit devices 45.

The diameter of the O ring 51 is larger than the inside diameter of the lower cylindrical supporting portion 24 and is smaller than the outside diameter of the lower cylindrical supporting portion 24. The diameter of the O ring 52 is larger than the diameter of the projecting part 35 and is smaller than the outside diameter of the upper cylindrical supporting portion 34.

The lower case member 20 and the upper case member 30 are fixed to each other with the gap between the lower peripheral-wall portion 22 and the upper peripheral-wall portion 32 being sealed with a gasket (not illustrated), whereby the supporting case 10 is obtained.

As illustrated in FIGS. 4 and 5, the lower cylindrical supporting portion 24 and the upper cylindrical supporting portion 34 pinch the mounting substrate 40 with the O rings 51 and 52 interposed therebetween, whereby the mounting substrate 40 is supported. The blanking plate 114 is exposed at the upper opening 33 of the upper case member 30.

Peripheral regions of the mounting substrate 40 that are on a peripheral side with respect to the part pinched between the lower cylindrical supporting portion 24 and the upper cylindrical supporting portion 34 (regions on the outer side of the O rings 51 and 52) are positioned in the space S that is defined by the bottom plate portion 21, the lower peripheral-wall portion 22, and the lower cylindrical supporting portion 24 of the lower case member 20 and the top lid portion 31, the upper peripheral-wall portion 32, and the upper cylindrical supporting portion 34 of the upper case member 30.

The space S is kept airtight by the gasket that seals the gap between the lower peripheral-wall portion 22 and the upper peripheral-wall portion 32 and by the O rings 51 and 52. The circuit devices 45 are disposed in the space S. Note that, before the lower case member 20 and the upper case member 30 are fixed to each other, the optical fibers 56 are passed through the feedthroughs 26 and are connected to the connectors 46 provided on the mounting substrate 40.

The circuit devices 45 are in contact with the top lid portion 31 with the heat-conducting sheets 53 interposed therebetween. The heat-conducting sheets 53 may be made of, for example, silicon rubber or carbon fibers.

The supporting case 10 that supports the mounting substrate 40 carrying the blanking plate 114 as described above is disposed on the rotating unit 140 provided in the electron lens barrel 102 of the drawing apparatus 100.

When a drawing process is performed by the drawing apparatus 100, the inside of the electron lens barrel 102 is vacuumed. The supporting case 10 has the pressure-relief valve 16 that is a bidirectional differential-pressure-regulating valve. Therefore, as the electron lens barrel 102 is vacuumed/relieved, the space S in the supporting case 10 is vacuumed/relieved. Since the pressure in the space S is adjustable to the pressure in the electron lens barrel 102, the required strength of the supporting case 10 can be lowered, and the size and weight of the supporting case 10 can be therefore reduced. In this respect, the pressure in the space S may be different from the pressure in the electron lens barrel 102 to some extent, and a self-operated differential pressure valve may be employed.

The space S is airtight. Therefore, even if the materials forming elements such as the circuit devices 45 and the heat-conducting sheets 53 generate gas in a low vacuum, such gas stays in the space S and is not exhausted to the outside of the supporting case 10. Hence, the contamination of the aperture member 113 and other elements can be prevented. Moreover, the number of options for the materials of the circuit devices 45 and the heat-conducting sheets 53 can be increased. Even if there is a possibility of some gas generation, circuit devices exhibiting high performance and heat-conducting sheets having high thermal conductivity can be employed.

The multiple beams formed by the aperture member 113 pass through the upper opening 33 of the upper case member 30, the passing holes of the blanking plate 114, the opening 41 of the mounting substrate 40, and the lower opening 23 of the lower case member 20. The blankers of the blanking plate 114 perform blanking deflection on the respective electron beams passing therethrough.

When the blanking plate performs any operation such as data transfer or blanking deflection, the circuit devices 45 are activated and generate heat. The heat is exhausted into the supporting case 10 through the heat-conducting sheets 53. The supporting case 10 is connected to the cooling plate 150 with the heat-conducting cable 58. The heat of the circuit devices 45 can be exhausted efficiently even in the electron lens barrel 102 that is in a vacuum state. Hence, the circuit devices 45 are prevented from becoming hot, and the occurrence of malfunctions can be prevented.

When the blanking plate performs any operation such as data transfer or blanking deflection, the electric current flowing through the circuit devices 45 and the mounting substrate 40 may generate high-frequency electromagnetic waves in the space S. Such electromagnetic waves are blocked by the supporting case 10. Therefore, the influence on the paths of the electron beams is reduced, and the deterioration in the drawing accuracy can be prevented.

When the electron beam is shaped by the aperture member 113, electrons are scattered at the edges of the holes (apertures) of the aperture member. As illustrated in FIG. 4, the projecting part 35 project downward from the upper cylindrical supporting portion 34 of the upper case member 30. The projecting part 35 is positioned on the inner peripheral side of the O ring 52 and protects the O ring 52 from scattered electrons. Therefore, the scattered electrons can be prevented from striking the O ring 52, and the O ring 52 can be prevented from being charged up. Moreover, the projecting part 35 prevents X rays generated by the electron beam striking the aperture member 113 from entering the space S, thereby protecting the circuit devices 45 from any damage due to such X rays.

The region of the mounting substrate 40 that is not positioned in the space S, that is, the region nearer to the center than the part pinched between the lower cylindrical supporting portion 24 and the upper cylindrical supporting portion 34, is plated with gold. Therefore, the generation of gas from the mounting substrate 40 can be prevented. Furthermore, the mounting substrate 40 can be prevented from being charged up by scattered electrons.

As described above, according to the present embodiment, since the peripheral regions of the mounting substrate 40 that are provided with the circuit devices 45 are positioned in the airtight space S of the supporting case 10, the influence of the gas generated from the circuit devices 45 can be reduced. Furthermore, since the circuit devices 45 are in contact with the supporting case 10 with the heat-conducting sheets 53 interposed therebetween and the supporting case 10 is connected to the cooling plate 150, the circuit devices 45 can be cooled efficiently. Furthermore, the influence of the electromagnetic field on the electron beams is reduced by positioning the circuit devices 45 in the space S, whereby the deterioration in the drawing accuracy can be prevented.

In the above embodiment, the pressure-relief valve 16 may be provided in the upper case member 30. Furthermore, a projecting part that projects upward from the upper end face of the lower cylindrical supporting portion 24 may be added so as to protect the O ring 51 from scattered electrons.

Second Embodiment

Figure 10:
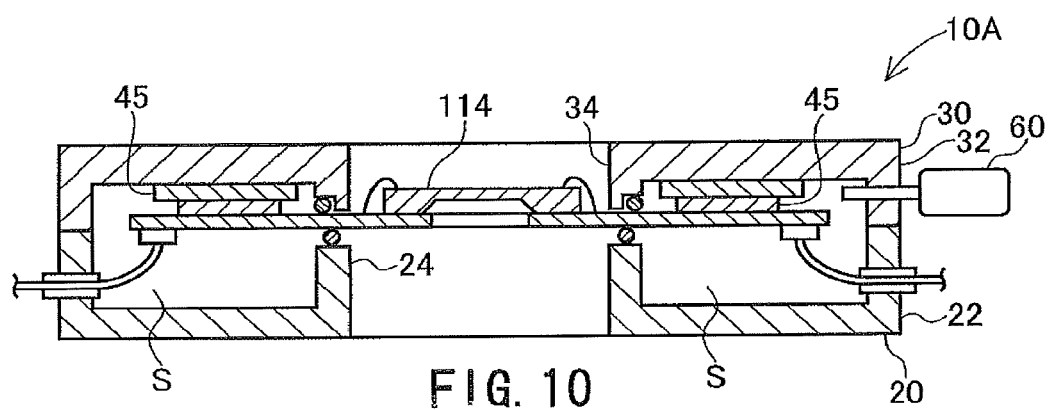
FIG. 10 is a sectional view of a supporting case according to a second embodiment.

FIG. 10 is a sectional view of a supporting case according to a second embodiment and corresponds to FIG. 4. Elements that are the same as those of the first embodiment illustrated in FIG. 4 are denoted by corresponding ones of the reference numerals, and description thereof is omitted. A supporting case 10A illustrated in FIG. 10 includes a gas cylinder 60 that supplies gas into the space S.

The gas cylinder 60 fills the space S with the gas at a specific pressure, so that an effect of heat radiation with the convection of the gas is produced. Thus, the heat generated from the circuit devices 45 and other elements can be exhausted more efficiently. The gas supplied from the gas cylinder 60 is preferably nitrogen gas, for example.

The rate of exhaustion of heat from the circuit devices 45 and other elements may be improved by filling the space S with insulating liquid such as fluorine-based inert liquid.

Third Embodiment

Figure 11:
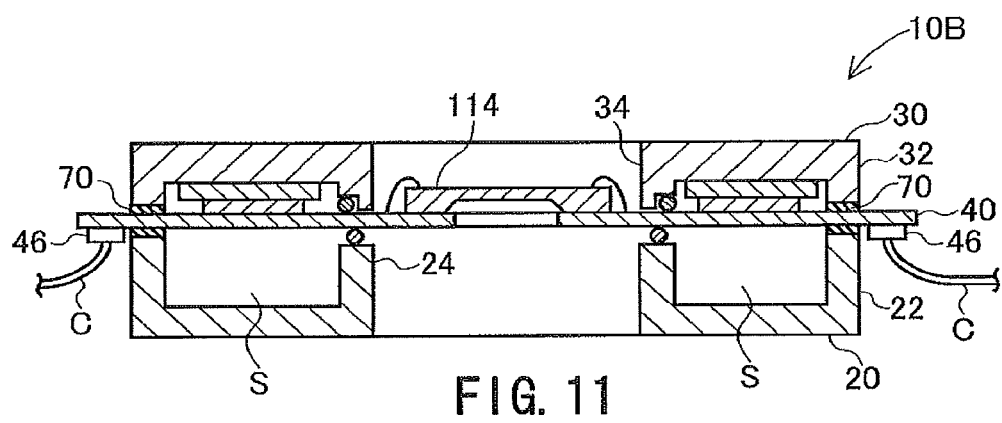
FIG. 11 is a sectional view of a supporting case according to a third embodiment.

FIG. 11 is a sectional view of a supporting case according to a third embodiment and corresponds to FIG. 4. Elements that are the same as those of the first embodiment illustrated in FIG. 4 are denoted by corresponding ones of the reference numerals, and description thereof is omitted. As illustrated in FIG. 11, the mounting substrate 40 has a long-side length greater than that of a supporting case 10B and is positioned in such a manner as to extend through the sidewalls of the supporting case 10B.

The positions of the supporting case 10B through which the mounting substrate 40 passes are sealed with sealing agent 70, so that the space S is kept airtight. The sealing agent 70 is preferably made of a material, such as epoxy-based adhesive, that is less likely to generate gas in a vacuum.

For example, recesses are provided in the peripheral-wall upper end face 22a of the lower case member 20 and in the peripheral-wall lower end face 32a of the upper case member 30. Then, the lower peripheral-wall portion 22 and the upper peripheral-wall portion 32 are fitted to each other such that the recesses thereof face each other. Thus, through holes that allow the mounting substrate 40 to pass therethrough are provided. The recesses that provide the through holes may be provided only one of the lower peripheral-wall portion 22 and the upper peripheral-wall portion 32.

The connectors 46 are provided on the lower surface of the mounting substrate 40 at the long-side ends that project from the supporting case 10B. The connectors 46 are connectable to cables C on the outside of the supporting case 10B.

The long-side ends of the mounting substrate 40 projecting from the supporting case 10B and exposed to the vacuum are preferably plated with gold. Thus, the generation of gas from the mounting substrate 40 can be prevented.

Fourth Embodiment

Figure 12:
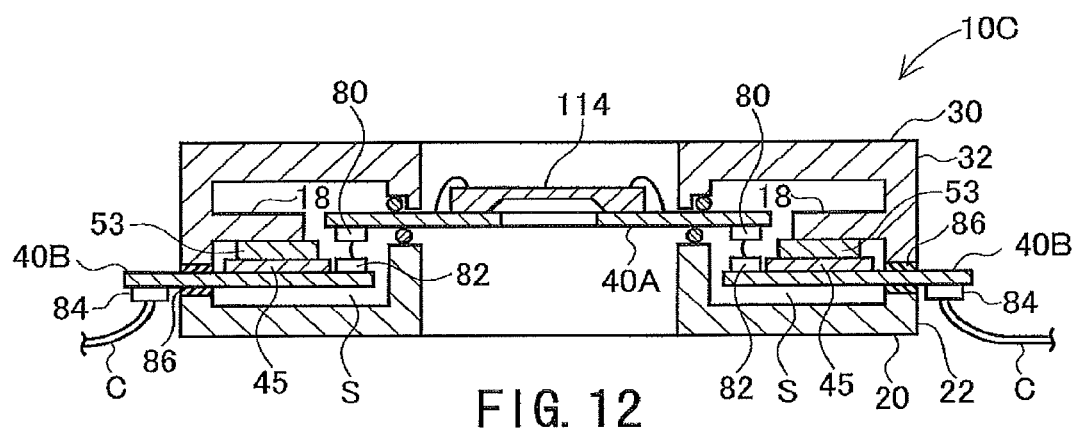
FIG. 12 is a sectional view of a supporting case according to a fourth embodiment.

FIG. 12 is a sectional view of a supporting case according to a fourth embodiment and corresponds to FIG. 4. Elements that are the same as those of the first embodiment illustrated in FIG. 4 are denoted by corresponding ones of the reference numerals, and description thereof is omitted. As illustrated in FIG. 12, there are provided a substrate 40A that carries the blanking plate 114, and a substrate 40B that carries the circuit devices 45. The substrate 40A and the substrate 40B are separate from each other.

Connectors 80 provided on the lower surface of the substrate 40A and connectors 82 provided on the upper surface of the substrate 40B are connected to each other. A supporting case 10C includes a heat-radiating part 18 extending horizontally inward from the inner wall surface of the peripheral-wall portion 32 thereof. The circuit devices 45 provided on the substrate 40B are in contact with the lower surface of the heat-radiating part 18 with the heat-conducting sheets 53 interposed therebetween.

The substrate 40B extends through the sidewalls of the supporting case 10C. The positions through which the substrate 40B passes are sealed with sealing agent 86, so that the space S is kept airtight. The sealing agent 86 may be the same as the sealing agent 70 described above.

Connectors 84 are provided on the lower surface of the substrate 40B at the long-side ends that project from the supporting case 10C. The connectors 84 are connectable to the cables C on the outside of the supporting case 10C.

Since the substrate 40A that carries the blanking plate 114 and the substrate 40B that carries the circuit devices 45 are separate from each other, only the substrate 40A that carries the blanking plate 114 can be interchanged with another.

Fifth Embodiment

Figure 13:
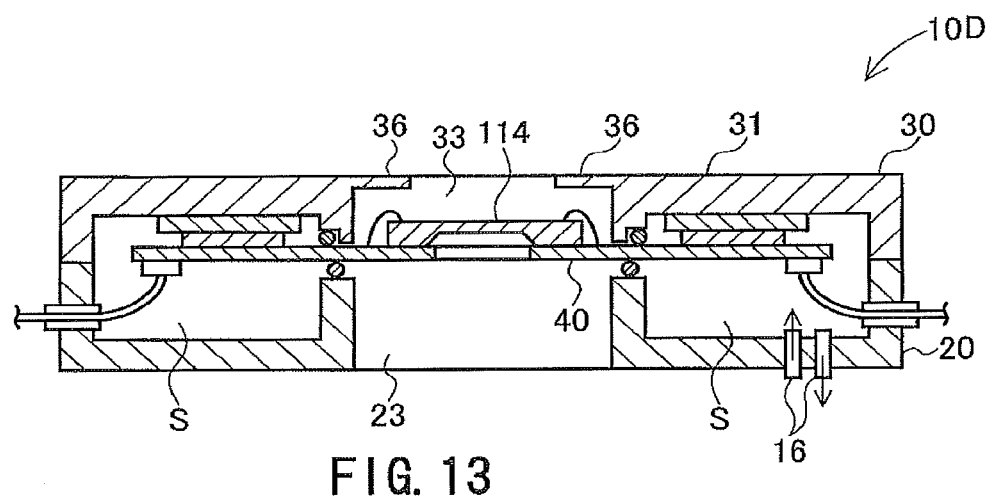
FIG. 13 is a sectional view of a supporting case according to a fifth embodiment.

FIG. 13 is a sectional view of a supporting case according to a fifth embodiment and corresponds to FIG. 4. As illustrated in FIG. 13, the upper case member 30 of a supporting case 10D includes a visor portion 36 projecting from at least part of the peripheral edge of the upper opening 33 toward the inner side (toward the center of the opening).

The visor portion 36 is provided in such a manner as to cover the pad portions 114a of the blanking plate 114 but not to block the electron beams passing through the blankers. Since the visor portion 36 is provided, scattered electron beams can be prevented from striking insulating films provided among the pad portions 114a and insulating films provided among the pad portions 42 of the mounting substrate 40 and from charging up the insulating films.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A supporting case that supports a mounting substrate for mounting a blanking plate, the blanking plate performing blanking deflection on a plurality of beams individually in a multi charged particle beam drawing apparatus, the supporting case comprising:
a lower case member including a bottom plate portion, a lower peripheral-wall portion standing from a peripheral edge of the bottom plate portion, and a lower cylindrical supporting portion standing from a peripheral edge of a lower opening provided in a plate central part of the bottom plate portion; and
an upper case member including a top lid portion, an upper peripheral-wall portion hanging from a peripheral edge of the top lid portion, and an upper cylindrical supporting portion hanging from a peripheral edge of an upper opening provided in a plate central part of the top lid portion,
wherein the lower peripheral-wall portion and the upper peripheral-wall portion are fitted with each other, with the mounting substrate being pinched between the lower cylindrical supporting portion and the upper cylindrical supporting portion, and
wherein peripheral regions of the mounting substrate that are on a peripheral side with respect to a part pinched between the lower cylindrical supporting portion and the upper cylindrical supporting portion are positioned in a space defined by the bottom plate portion, the lower peripheral-wall portion, and the lower cylindrical supporting portion of the lower case member and the top lid portion, the upper peripheral-wall portion, and the upper cylindrical supporting portion of the upper case member.

2. The supporting case according to claim 1,
wherein a first O ring is provided between the lower cylindrical supporting portion and the mounting substrate, a second O ring is provided between the upper cylindrical supporting portion and the mounting substrate, and the lower cylindrical supporting portion and the upper cylindrical supporting portion pinch the mounting substrate with the first O ring and the second O ring interposed therebetween, and
wherein an annular projecting part projects downward from a lower end face of the upper cylindrical supporting portion, and the projecting part has a diameter smaller than a diameter of the second O ring.

3. The supporting case according to claim 1,
wherein circuit devices are provided on the peripheral regions of the mounting substrate,
wherein heat-conducting sheets are provided on the circuit devices, and
wherein the heat-conducting sheets are in contact with the upper case member.

4. The supporting case according to claim 3,
wherein a heat-radiating part extends from the upper peripheral-wall portion into the space, and
wherein the heat-conducting sheets are in contact with the heat-radiating part.

5. The supporting case according to claim 4, wherein the mounting substrate includes a first substrate that carries the blanking plate, and a second substrate that carries the circuit devices.

6. The supporting case according to claim 1, wherein the lower case member or the upper case member has a pressure-relief valve.

7. The supporting case according to claim 1, further comprising a gas-supplying unit that supplies gas into the space.

8. The supporting case according to claim 1, wherein the space is filled with insulating liquid.

9. The supporting case according to claim 1, wherein the lower peripheral-wall portion and/or the upper peripheral-wall portion has a through hole through which the mounting substrate extends.

10. The supporting case according to claim 1, wherein the upper case member includes a visor portion projecting from a peripheral edge of the upper opening toward a center of the opening.

11. The supporting case according to claim 1, wherein the lower case member and the upper case member are made of a nonmagnetic material.

12. A multi charged particle beam drawing apparatus comprising:
- a stage that carries a sample and that is continuously movable;
- an emitter emitting a charged-particle beam;
- an aperture member having a plurality of apertures and that receives the charged-particle beam in an area having all of the plurality of apertures, the aperture member forming multiple beams when portions of the charged-particle beam pass through the plurality of apertures, respectively;
- a blanking plate including a plurality of blankers, the blankers performing blanking deflection on the respective multiple beams having passed through the plurality of apertures of the aperture member;
- a mounting substrate carrying the blanking plate;
- a supporting case supporting the mounting substrate;
- a rotating unit rotating the supporting case;
- a restricting aperture member blocking the beams deflected in such a manner as to be turned off by the plurality of blankers; and
- a lens focusing the multiple beams having passed through the restricting aperture member on the sample, wherein the supporting case includes
- a lower case member that includes a bottom plate portion, a lower peripheral-wall portion standing from a peripheral edge of the bottom plate portion, and a lower cylindrical supporting portion standing from a peripheral edge of a lower opening provided in a plate central part of the bottom plate portion; and
- an upper case member that includes a top lid portion, an upper peripheral-wall portion hanging from a peripheral edge of the top lid portion, and an upper cylindrical supporting portion hanging from a peripheral edge of an upper opening provided in a plate central part of the top lid portion, wherein the lower peripheral-wall portion and the upper peripheral-wall portion are fitted with each other, with the mounting substrate being pinched between the lower cylindrical supporting portion and the upper cylindrical supporting portion, and wherein peripheral regions of the mounting substrate that are on a peripheral side with respect to a part pinched between the lower cylindrical supporting portion and the upper cylindrical supporting portion are positioned in a space defined by the bottom plate portion, the lower peripheral-wall portion, and the lower cylindrical supporting portion of the lower case member and the top lid portion, the upper peripheral-wall portion, and the upper cylindrical supporting portion of the upper case member.

13. The apparatus according to claim 12, further comprising a cooling plate through which cooling water flows, wherein the supporting case is connected to the cooling plate with a heat-conducting cable.

14. The apparatus according to claim 12, wherein the mounting substrate has a beam-passage-allowing opening in a plate central part, and a surface of at least a part of a region of the mounting substrate is covered with a gold plate, the region being not positioned in the space.

15. The apparatus according to claim 14, wherein a side surface of the beam-passage-allowing opening is covered with the gold plate.

* * * * *